United States Patent [19]

Rühle et al.

[11] Patent Number: 4,604,637
[45] Date of Patent: Aug. 5, 1986

[54] LIGHT-EMITTING DIODE SUITABLE AS A PRESSURE SENSOR

[75] Inventors: Wolfgang Rühle, Erlangen; Claus Weyrich, Gauting, both of Fed. Rep. of Germany

[73] Assignee: Siemens Aktiengesellschaft, Berlin & Munich, Fed. Rep. of Germany

[21] Appl. No.: 470,953

[22] Filed: Mar. 1, 1983

[30] Foreign Application Priority Data

Mar. 19, 1982 [DE] Fed. Rep. of Germany ....... 3210086

[51] Int. Cl.$^4$ ...................... H01L 33/00; H01L 29/84
[52] U.S. Cl. ......................................... 357/17; 357/16; 357/19; 357/26; 357/30; 357/61
[58] Field of Search ...................... 357/17, 26, 16, 30, 357/61, 19

[56] References Cited

U.S. PATENT DOCUMENTS

| | | | |
|---|---|---|---|
| 3,384,837 | 5/1968 | Toussaint et al. | 357/19 |
| 3,525,947 | 8/1970 | Winstel et al. | 330/4 |
| 3,566,215 | 2/1971 | Heywang | 357/16 |
| 4,141,025 | 2/1979 | Bronshtein et al. | 357/26 |
| 4,274,103 | 6/1981 | Yamamoto et al. | 357/30 |
| 4,278,986 | 7/1981 | Mader | 357/30 |

FOREIGN PATENT DOCUMENTS 2616649  11/1977  Fed. Rep. of Germany ........ 357/19

OTHER PUBLICATIONS

Kaliski et al., "Pressure Dependence of $Al_x Ga_{1-x}As$ Light Emitting Diode Near the Direct–Indirect Transition", J. Appl. Phys. 57 (5), Mar. 1, 1985, pp. 1734–1738.
Nelson et al., "Effect of Composition and Pressure on the Nitrogen Isoelectronic Trap in $GaAs_{1-x}P_x$", Jul. 15, 1976, Physical Review, vol. 14, No. 2, pp. 685–690.

Primary Examiner—James W. Davie
Assistant Examiner—Georgia Y. Epps
Attorney, Agent, or Firm—Hill, Van Santen, Steadman & Simpson

[57] ABSTRACT

A light-emitting diode comprises III-V semiconductor material having a pn junction as its light-active zone from which luminescent radiation is emitted, the radiation having a pressure-dependent characteristic. The diode is characterized in that, for the purpose of pressure-dependent brightness of the light radiation, the composition of the light-active zone at the pn junction comprises a semiconductor material which has a composition which corresponds to a position close to the transition from a direct energy gap to an indirect energy gap and at which a change of the composition would result in a significant change in the brightness of the emission. The invention is particularly useful for potential-free measurement of pressure forces.

11 Claims, 3 Drawing Figures

LIGHT-EMITTING DIODE SUITABLE AS A PRESSURE SENSOR

BACKGROUND OF THE INVENTION

1. Field of the Invention

The present invention relates to a light-emitting diode which comprises III-V semiconductor material having a pn junction as its light-active zone from which luminescent radiation having a pressure-dependent nature is emitted.

2. Description of the Prior Art

It is well known in the art that, given influence of mechanical pressure on a light-emitting diode, the band gap of the semiconductor material of the diode is changed and, therefore, a pressure-dependent frequency change of the emitted luminescent radiation occurs. The use of such light-emitting diodes as pressure sensors is basically opposed by the disadvantage that frequency shifts of emitted radiation can be quantitatively detected as would be required for a measuring sensor only with very complex structure.

U.S. Pat. No. 3,387,230 discloses an electro-optical transistor wherein one region (of the semiconductor body) of the transistor is exposed to selective, elastic mechanical distortion. Therefore, influence on the photons traversing this region is also achieved, as indicated at column 2, lines 31–34. Therefore, a region in the semiconductor body which is located adjacent to the pn junction generating the radiation is exposed to elastic distortion. Therefore, the generation of radiation is not influenced as a result of mechanical effect (column 2, line 55 through column 3, line 3). The physical foundation of the subject matter of this patent is that different absorption of the radiation already generated is present, being influenced by mechanical distortion and being frequency-dependent (column 6, lines 49–62).

British Letters Pat. No. 1,028,250 discloses a semiconductor device with which existing mechanical oscillations are to be converted into electrical signals. The semiconductor devices in this case is a laser diode which differs from a light-emitting diode in that it is an optical amplifier and its semiconductor body is necessarily designed as an optical resonator having mutually-opposed reflection surfaces. Given this structure, the generation of radiation is not influenced by the mechanical oscillations. On the contrary, what is exploited is that a movement of the overall radiation-generating diode effected by mechanical oscillation makes the transmission of its radiation to a stationary receiver diode dependent on such motion. This, for example, could not be achieved with a light-emitting diode instead of the laser diode since a light-emitting diode does not exhibit focused radiation conversion as occurs given a laser diode and the light-emitting diode would permit radiation to proceed into the receiver practically uninfluenced by its mechanical motion.

Disclosed in "Applied Physics Letters", Vol. 29 (1969), pp. 615–617, is a light-emitting diode which is modulated with hydrostatic pressure, the light-emitting diode being a nitrogen-doped gallium arsenide phosphide diode. The material composition of the diode in this case is necessarily of such nature that the radiation-generating charge carrier transitions are not direct transitions from the conduction band to the valence band, but are necessarily indirect transitions over nitrogen luminous centers. Given such a diode, a certain pressure dependency of the radiation generation can be identified from which scientific perceptions concerning the physical mechanism of the radiation generation with charge carrier junctions via nitrogen luminous centers can be obtained. As specified in this publication at Page 616, left-hand column, center, an intensity decrease of approximately 85% was identified; however, for a pressure change from zero to the enormous value of 6 Kbar, i.e. approximately 6 tons/cm$^2$.

A further publication, namely the German published patent application No. 31 01 047 discloses a fiber-optical measuring device for measuring a force or a pressure. The concern given this measuring device is to make the measuring signal independent of changes of both the intensity and the wavelength of the light of the appertaining light source. The measuring device is designed such that the optical signal received in the detector system is dependent on the pressure or, respectively, on the force to be measured. The light-emitting diode of this measuring device, generating primary radiation, is not subjected to any mechanical pressure. On the contrary, the mechanical pressure (F) influences an additional semiconductor sensor which, as a result of incident light radiation from the light-emitting diode, emits a pressure-dependent luminescent spectrum. As indicated in this publication, the pressure or, respectively, force influence on the sensor is to such effect that the frequency of the luminescent radiation of the sensor is changed. This pressure-dependent frequency change is then determined in the detector upon the use of a further, frequency-selective filter. The sensor influenced by the pressure or, force, moreover, has no electrical terminals, i.e. it is not permeated by current.

SUMMARY OF THE INVENTION

The object of the present invention, therefore, is to provide a pressure sensor which is suitable for potential-free measurement.

The above object is achieved with a light-emitting diode of the type generally set forth above which is characterized in that, for the purpose of a pressure-dependent brightness of the light emission of the diode, the composition of the light-active zone comprises a semiconductor material which has a composition such as corresponds to a position close to the transition from the direct energy gap to an indirect energy gap and at which a change of the composition would entrain a significant change in the brightness of the emission.

It is known from scientific investigations of the fundamental behavior and the characteristic properties of semiconductor materials that individual semiconductor materials exhibit a so-called direct energy gap while other semi-conductor materials exhibit a so-called indirect energy gap. Direct energy gap means that a "charge carrier" transition from the conduction band into the valence band, connected with light emission, occurs such that only the energy change of the quantum state corresponding to the emitted light quantum occurs. Given materials having an indirect energy gap, however, it is not only this energetic state change which occurs but, rather, a momentum change also necessarily enters, given which a phonon may also participate in terms of quantum physics. A typical representative of semiconductor material having a direct energy gap is gallium arsenide and gallium aluminum arsenide having an aluminum content which is not very great. Given a comparatively much higher aluminum content, on the other hand, such mixed semiconductors have an indirect energy gap with the corresponding additional condition for possible (radiative) transitions between the conduction band and the valence band. Other examples of semiconductor materials which, depending upon the degree of mixing, exhibit direct or indirect energy gaps or gallium arsenide phosphide, indium aluminum phosphide and indium aluminum arsenide, as well as quaternary compounds of which only gallium aluminum arsenide phosphide is mentioned here as a typical representative by way of a first example.

Scientific investigations have likewise been undertaken as to how, as fundamental examples, the above mixed semiconductors behave when the content of the two antagonists (for example, gallium and aluminum in gallium aluminum arsenide) has such a ratio for x corresponding to a composition $Ga_{l-x}Al_xAs$, values which lies in the area of the transition from a direct energy gap to an indirect energy gap. It has been discovered that the quantum yield for luminescent radiation of an appertaining diode in such a region depends to an extremely high degree on the respective, precise value of x, i.e. on the precise composition. Whereas gallium aluminum arsenide having values of x below $(0<x<0.4)$ has a decidedly high quantum efficiency and, therefore, high luminosity, diodes consisting of a gallium aluminum arsenide material with $x>0.4$, i.e. having a higher aluminum content, exhibit only a small quantum efficiency.

It has already been discovered that such an effect can be produced by applying pressure to semiconductor material of an appertaining type, as though the composition explained above concerning the value x were being changed. The present invention proceeds on the basis of this perception, to a particularly high degree, leads to light-emitting diodes having a pressure-dependent emission power or, respectively, to pressure sensors, that is, sensors for hydrostatic and uniaxial pressure, as well as for forces, accelerations, oscillations, converted into pressure on the light emitting diode, which permit potential-free pressure measurement. With a diode constructed in accordance with the present invention or, respectively, given use of a diode according to the present invention, a logarithmic coverage of great pressure ranges can be achieved in a simple manner, i.e. for high pressures, for example, in the danger area, pressure display exhibits the character of a display with "spread or expanded" display. The invention particularly offers advantages with regard to the fact that brightness changes are far easier to quantitatively detect in terms of mensuration technology than are frequency changes of emitted light radiation.

BRIEF DESCRIPTION OF THE DRAWING

Other objects, features and advantages of the invention, its organization, construction and mode of operation will be best understood from the following detailed description taken in conjunction with the accompanying drawing, on which.

DESCRIPTION OF THE PREFERRED EMBODIMENTS

Figure 1:
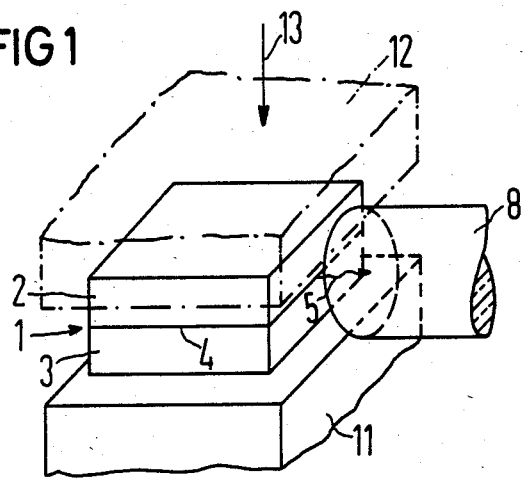
FIG. 1 is a perspective view of a first embodiment of a diode constructed in accordance with the present invention.

Referring to FIG. 1, a light-emitting diode 1 is illustrated which consist of a material of the type set forth above, wherein the composition of the mixture of the light emitting part is selected such that the value x is in the range of the transition from a direct energy gap to an indirect energy gap. The diode 1 comprises a first component 2 in which the appertaining semiconductor material exhibits the one conductivity type (n or p). Another component 3 comprises the same semiconductor material, however with the opposite conductivity type (p or n). The emitted luminescent radiation 5 is generated in the region of the junction 4 between the components 2 and 3 in response to current passage. Respective electrodes are disposed on the two outer surfaces of the diode 1 parallel to the junction 4 for the application of current. The base 11 and the pressure die 12 sandwiches the diode 1 therebetween and can be loaded with a pressure as indicated by the arrow 13, which pressure is to be measured with the assistance of the diode 1. It can be advantageous to forward the light 5 emitted from the junction 4 of the diode 1 with the assistance of a light conductor 8, for example a fiber optical waveguide. Base 11 and 12, consisting of metal, may also be used as electrodes and contacts to electric conductors.

Figure 2:
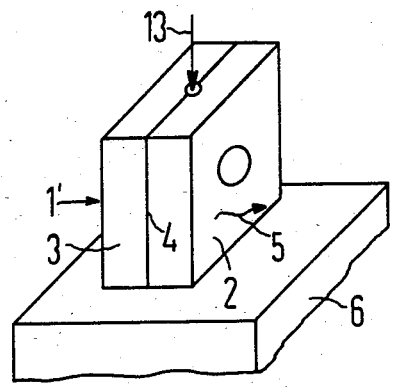
FIG. 2 is a schematic representation of a second embodiment of the invention.

FIG. 2 illustrates a device which basically coincides with that of FIG. 1. The significant difference is the disposition of the diode 1' whose junction 4 in this example is directed such that its mathematical surface normal is perpendicular to the effect of the pressure 13 (to be measured). The emitted radiation 5 here occurs orthogonally relative to the plane of the junction 4. The electrodes (not illustrated) of the diode 1 are located at the two parts of the diode 1 situated at the two sides of the junction 4, preferably on the surfaces parallel to the junction 4.

Figure 3:
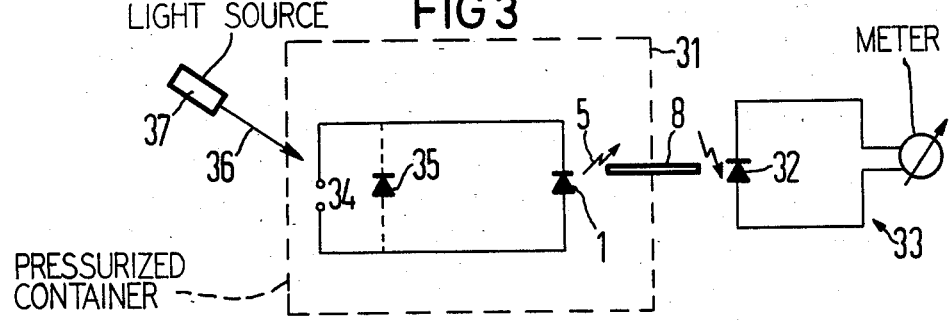
FIG. 3 is a schematic diagram illustrating the use of a light-emitting diode according to the invention.

Referring to FIG. 3, a schematic illustration is provided which shows a pressure measuring arrangement. A container 31 is, for example, a boiler whose internal pressure (predominantly hydrostatic pressure in this case) is to be measured. A light-emitting diode 1 is located within the container 31 and is light-coupled to a light-conducting element 8, for example a fiber optical waveguide which is provided, in particular, for loss-free light transmission and, under certain conditions, for light transmission which is not on a straight path from the diode 1 to a detector 32. The detector 32 can be, for example, a photo diode which is a component of the quantitative measuring detector 33.

As can be seen, the transmission of the measurable variable can occur in a potential-free manner from the diode 1 to the detector 32 or, respectively, 33. The container 31 and the detector 33 can therefore lie at electrical potentials which are very different from one another.

A light-emitting diode constructed in accordance with the present invention is to be fed with the electrical current from which the diode takes energy for the generated light emission. Fundamentally, this current can be supplied over terminals 34 in the illustrated circuit. In order, however, to also be potential-free for this purpose, a photo diode, illustrated as being connected by broken lines, can advantageously be provided instead of the current terminals 34, the photodiode, given irradiation with corresponding light radiation 36, acting as a sufficiently strong photo-electrical generator (and making any other external current supply superfluous. The radiation 36 can be generated, for example, by a light-emitting diode or a laser diode 37 which is fed in a corresponding manner from the supply line.

Although we have described our invention by reference to particular illustrative embodiments thereof, many changes and modifications of the inventin may become apparent to those skilled in the art without departing from the spirit and scope of the invention, that is, e.g., any acceleration or force can be converted into pressure on the light emitting diode. We therefore intend to include within the patent warranted hereon all such changes and modifications as may reasonably and properly be included within the scope of our contribution to the art.

We claim:

1. A luminescent diode including electrodes for supporting a constant current flow and responsive to pressure with pressure-dependent brightness of emitted luminescent radiation, said diode comprising:
   a semiconductor body of III-V mixed semiconductor material consisting of $GA_{l-x}Al_xAs$ and dopants, wherein $0 < x < 0.4$, and including
      a first component of said body comprising p-conductive material, and
      a second component of said body comprising n-conductive material and forming a pn junction with said first component to define an active zone for emitting luminescent radiation,
   the value of mixture of said semiconductor material being selected as an energy gap material close to the transition from a direct energy gap to an indirect energy gap and at which a change of the value x of the composition would result in a significant change in the brightness of emission so that exertion of pressure on said diode results in a pressure induced transition.

2. The luminescent diode of claim 1, wherein said semiconductor material comprises gallium aluminum arsenide phosphide.

3. The luminescent diode of claim 1, wherein said semiconductor material comprises $Ga_{l-x}Al_xAs$, where x is in the range $0 < x < 0.4$.

4. A pressure sensor comprising:
   a luminescent diode for supporting a current flow and responsive to pressure to produce pressure-dependent luminescent radiation, said diode comprising
      a semiconductor body of III-V mixed semiconductor material consisting of $Ga_{l-x}Al_xAs$ and dopants, wherein $0 < x < 0.4$, and a pair of electrodes carried on said body, said body comprising
      a first p-conductive component of the III-V semiconductor material and carrying one of said electrodes;
      a second n-conductive component of the same III-V semiconductor material forming a pn junction with said first component to define an active light zone for emitting radiation, and carrying the other of said electrodes, and
   a pair of electrical conductors for connection to a current source connected to said pair of electrodes, respectively, for supporting a constant current flow through said diode,
   said active light zone comprising a value of mixture of said semiconductor material selected as a direct energy gap material close to the transition from the direct energy gap to an indirect energy gap and at which a change of the value X of the composition would result in a significant change in the brightness of emission so that an exertion of pressure on said diode results in a pressure induced transition; and
   light detection means coupled to said luminescent diode, including indicating means for indicating pressure as a function of the brightness of the detected light.

5. The pressure sensor of claim 4, and further comprising:
   a light waveguide coupling said light-emitting diode to said light detection means.

6. The pressure sensor of claim 4, wherein said light detection means comprises:
   a photo diode; and
   a meter connected to said photo diode.

7. The pressure sensor of claim 4, and further comprising:
   a current source connected to said electrical conductors.

8. The pressure sensor of claim 4, and further comprising:
   a photo diode connected to said electrical conductors; and
   a light source irradiating said photo diode.

9. The pressure sensor of claim 8, wherein:
   said light source comprises a further light-emitting diode.

10. The pressure sensor of claim 8, wherein:
    said light source comprises a laser diode.

11. A method of measuring pressure comprising the steps of:
    applying pressure to a light-emitting diode which emits pressure-dependent luminescent radiation from an active light zone of a pn junction which has a semiconductor material composition corresponding to a position close to a transition from a direct energy gap to an indirect energy gap and at which a change in the composition would result in a significant change in the brightness of emission;
    contemporaneously flowing direct current through the diode to stimulate luminescent radiation;
    detecting the luminescent radiation; and
    indicating the magnitude of the applied pressure as a function of the brightness of the light radiation.

* * * * *